United States Patent
Wang et al.

(10) Patent No.: US 12,148,966 B2
(45) Date of Patent: Nov. 19, 2024

(54) PHASE SHIFTER INCLUDING A DIELECTRIC SUBSTRATE HAVING A FIRST PART COVERED BY A TRACE AND A SECOND PART WITH A HOLLOWED OUT AREA

(71) Applicant: Outdoor Wireless Networks LLC, Claremont, NC (US)

(72) Inventors: Yan Wang, Suzhou (CN); Xun Zhang, Suzhou (CN); Hangsheng Wen, Suzhou (CN); Long Shan, Suzhou (CN)

(73) Assignee: Outdoor Wireless Networks LLC, Claremont, NC (US)

( * ) Notice: Subject to any disclaimer, the term of this patent is extended or adjusted under 35 U.S.C. 154(b) by 260 days.

(21) Appl. No.: 17/945,224

(22) Filed: Sep. 15, 2022

(65) Prior Publication Data
US 2023/0090118 A1 Mar. 23, 2023

(30) Foreign Application Priority Data
Sep. 22, 2021 (CN) .......................... 202111104482.1

(51) Int. Cl.
| | |
|---|---|
| *H01P 1/18* | (2006.01) |
| *H01P 3/08* | (2006.01) |
| *H01Q 3/32* | (2006.01) |
| *H05K 1/02* | (2006.01) |

(52) U.S. Cl.
CPC .............. *H01P 1/184* (2013.01); *H01P 3/087* (2013.01); *H01Q 3/32* (2013.01); *H05K 1/024* (2013.01); *H05K 2201/10098* (2013.01)

(58) Field of Classification Search
CPC ............. H01P 1/184; H01P 1/18; H01P 3/087
USPC .......................................................... 333/161
See application file for complete search history.

(56) References Cited

U.S. PATENT DOCUMENTS

| | | | | |
|---|---|---|---|---|
| 4,521,755 A * | 6/1985 | Carlson et al. | ......... | H01P 3/087 333/204 |
| 5,012,319 A * | 4/1991 | Dykaar et al. | ...... | H01L 23/5221 257/664 |
| 5,065,122 A * | 11/1991 | Juskey et al. | ........... | H01P 3/081 333/238 |
| 6,714,104 B1 * | 3/2004 | Salmela | .................. | H01P 3/084 333/246 |
| 7,432,775 B2 * | 10/2008 | Dutta | ........................ | H01P 3/08 257/E23.173 |
| 2009/0031561 A1 | 2/2009 | Huang et al. | | |
| 2013/0076453 A1* | 3/2013 | Lai et al. | ................. | H01P 1/184 333/125 |
| 2021/0151881 A1 | 5/2021 | Lei et al. | | |

FOREIGN PATENT DOCUMENTS

| | | |
|---|---|---|
| CN | 108808180 A | 11/2018 |
| CN | 109273815 A | 1/2019 |

* cited by examiner

*Primary Examiner* — Benny T Lee
(74) *Attorney, Agent, or Firm* — Myers Bigel, P.A.

(57) ABSTRACT

A phase shifter includes a printed circuit board and a trace located on the printed circuit board that is configured to transmit signals. The printed circuit board includes a first part covered by the trace and a second part not covered by the trace, where the second part includes at least one hollowed out area near the trace.

9 Claims, 7 Drawing Sheets

PHASE SHIFTER INCLUDING A DIELECTRIC SUBSTRATE HAVING A FIRST PART COVERED BY A TRACE AND A SECOND PART WITH A HOLLOWED OUT AREA

CROSS-REFERENCE TO RELATED APPLICATION

The present application claims priority to Chinese Patent Application No. 202111104482.1, filed Sep. 22, 2021, the entire content of which is incorporated herein by reference as if set forth fully herein.

FIELD

The present disclosure relates to the field of communications, and specifically, to a phase shifter and manufacturing method thereof.

BACKGROUND

Phase shifters are a device that is capable of adjusting the phase of radio signals. Phase shift may be introduced to radio frequency (RF) signals by transmitting RF signals in a medium. Phase shifters are a device that uses this principle to change the phase of RF signals.

SUMMARY OF THE INVENTION

According to one aspect of the present disclosure, a phase shifter is provided, including a printed circuit board and a trace located on the printed circuit board, configured to transmit signals. The printed circuit board includes a first part covered by the trace and a second part not covered by the trace, where the second part includes at least one hollowed out area near the trace.

In some embodiments, the printed circuit board includes a first surface and a second surface opposite to the first surface, where the trace is provided on the first surface and second surface and the trace on the first surface is electrically connected to the trace on the second surface through a through hole.

In some embodiments, the second part further includes: a frame, located at the periphery of the printed circuit board.

In some embodiments, the frame is substantially rectangular in shape.

In some embodiments, the frame includes a first side and a second side opposite to each other, and the second part further includes: a support bar, where two ends of the support bar are connected to the first side and second side of the frame, respectively.

In some embodiments, the frame further includes a third side and a fourth side extending in a second direction, in which, the first side and second side of the frame extend in a first direction different from the second direction, and the length of the third side is shorter than the length of the first side.

In some embodiments, the phase shifter further includes: a resistor, provided on the printed circuit board and electrically connected to the trace.

In some embodiments, at least one part of the surface in the second part of the printed circuit board is provided with a metal layer, and the metal layer is insulated from the trace.

According to another aspect of the present disclosure, a base station antenna is provided, including the phase shifter according to the present disclosure.

According to yet another aspect of the present disclosure, a method for manufacturing the phase shifter is provided, including providing a printed circuit board, where the printed circuit board includes a first part and a second part; forming a trace for transmitting signals on the first part of the printed circuit board; removing a part of the second part of the printed circuit board to form at least one hollowed out area located near the trace.

In some embodiments, the printed circuit board includes a first surface and a second surface opposite to the first surface, where the trace is formed on the first surface and second surface.

In some embodiments, a plurality of hollowed out areas are formed such that the second part of the printed circuit board is located on a frame at the periphery of the printed circuit board.

In some embodiments, the frame is substantially rectangular in shape.

In some embodiments, the frame includes a first side and second side opposite to each other, a plurality of hollowed out areas are formed such that the second part of the printed circuit board includes a support bar, where ends of the support bar are connected to the first side and second side of the frame, respectively.

In some embodiments, the frame further includes a third side and a fourth side extending in a second direction, in which, the first side and second side of the frame extend in a first direction different from the second direction, and the length of the third side is shorter than the length of the first side.

In some embodiments according to the present disclosure, the method further includes providing a resistor on the printed circuit board, such that the resistor is electrically connected to the trace.

In some embodiments, the method further includes providing a metal layer on the surface of at least one part in the second part of the printed circuit board, such that the metal layer is insulated from the trace.

Through the following detailed description of exemplary embodiments of the present disclosure by referencing the attached drawings, other features and advantages of the present disclosure will become clear.

Note, in the embodiments described below, the same signs are sometimes jointly used between different attached drawings to denote the same parts or parts with the same functions, and repeated descriptions thereof are omitted. In this Specification, similar labels and letters are used to indicate similar items. Therefore, once an item is defined in one attached drawing, it does not need to be further discussed in subsequent attached drawings.

For ease of understanding, the position, dimension, and range of each structure shown in the attached drawings and the like may not indicate the actual position, dimension, and range. Therefore, the disclosed invention is not limited to the positions, dimensions, and ranges disclosed in the attached drawings and the like.

DETAILED DESCRIPTION OF THE INVENTION

Various exemplary embodiments of the present disclosure will now be described in detail by referencing the attached drawings. It should be noted: unless otherwise specifically stated, the relative arrangement, numerical expressions and numerical values of components and steps set forth in these embodiments do not limit the scope of the present disclosure.

The technologies, methods, and equipment known to those of ordinary skill in the art may not be discussed in detail, but where appropriate, the technologies, methods, and equipment should be regarded as part of the granted Specification.

In all examples shown and discussed herein, any specific value should be construed as merely exemplary value and not as limiting value. Therefore, other examples of the exemplary embodiment may have different values.

Figure 1:
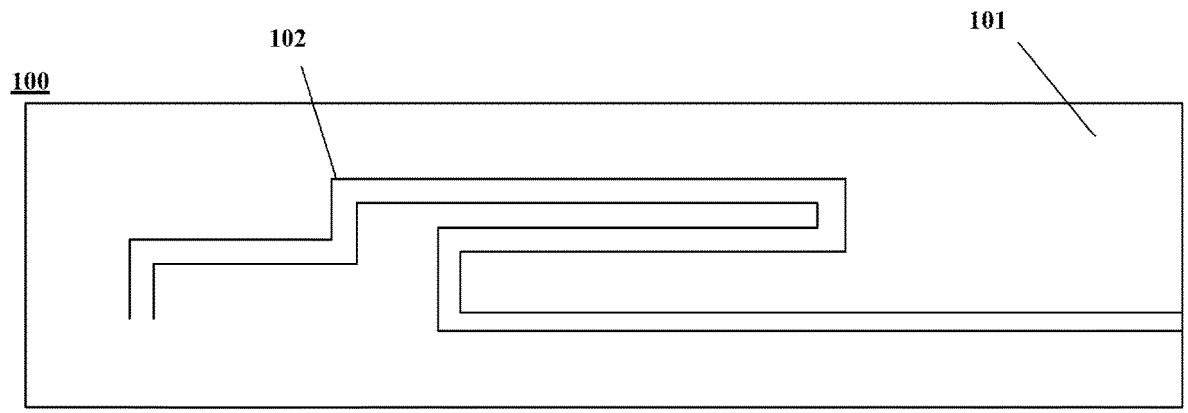
FIG. 1 shows a schematic diagram of a conventional phase shifter.

FIG. 1 shows a schematic diagram of a conventional cavity phase shifter. As shown in FIG. 1, the phase shifter 100 includes a printed circuit board 101 and a trace 102 formed on the printed circuit board 101. Signals transmitted in the trace 102 of the phase shifter 100 are easily affected by the base material of the printed circuit board 101, causing insertion loss to increase.

In addition, although it is not shown in FIG. 1, those with ordinary skill in the art should understand that the cavity phase shifter may further include, for example, a metal cavity and a sliding dielectric block. The length of the trace 102 covered by the dielectric block may be changed by sliding the dielectric block with respect to the trace 102, thereby changing the phase of signals transmitted in the trace 102 (for example, RF signals). Similarly, in other attached drawings of the present disclosure, the trace part in the phase shifter is also only shown exemplarily and other structures are omitted.

Figure 2:
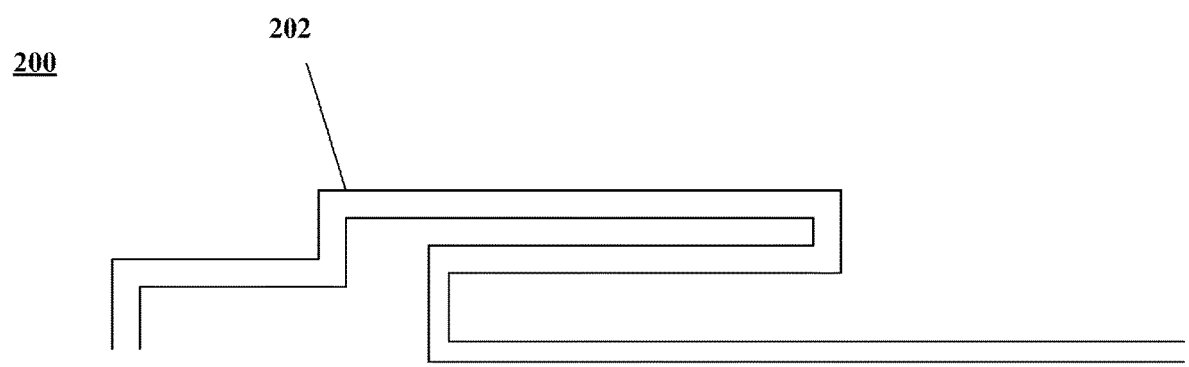
FIG. 2 shows a schematic diagram of another conventional phase shifter.

FIG. 2 shows a schematic diagram of another conventional phase shifter. As shown in FIG. 2, the phase shifter 200 includes a trace 202. The trace 202 may be a punched sheet metal trace. As compared to the phase shifter 100 in FIG. 1, the phase shifter 200 does not have a base material. Therefore, the insertion loss of signals transmitted in the trace 202 is smaller. However, as the phase shifter 200 only has a trace 202, it is difficult to keep the trace 202 stable.

Figure 3:
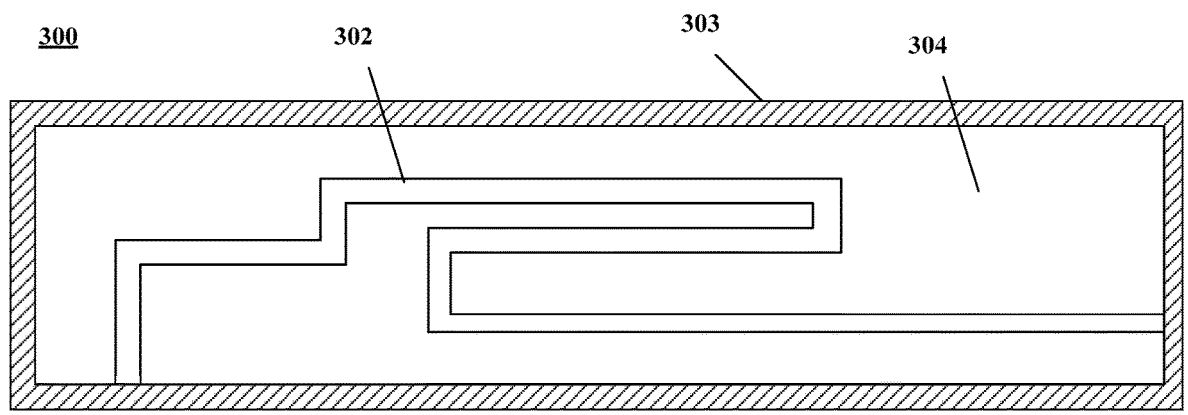
FIG. 3 shows a schematic diagram of a phase shifter according to some embodiments of the present disclosure.

FIG. 3 shows a schematic diagram of a phase shifter according to some embodiments of the present disclosure. As shown in FIG. 3, the phase shifter 300 includes a frame 303, a trace 302, and a hollowed out area 304.

Signals (for example, RF signals) may be transmitted over the trace 302. The trace 302 may be comprise a patterned metal layer of a printed circuit board.

The frame 303 may be part of the printed circuit board. For example, after forming the trace 302 on the printed circuit board, the part of the printed circuit board that does not form the trace 302 may be removed, only keeping the peripheral part of the printed circuit board as the frame 303. As such, the hollowed out area 304 may be formed in the printed circuit board.

The frame 303 and the base material of the printed circuit board located below the trace 302 are capable of providing support to the trace 302, keeping the trace 302 stable.

Removing the base material in the hollowed out area 304 helps to reduce insertion loss of signals transmitted through the phase shifter 300.

According to the above description, in the phase shifter 300 shown in FIG. 3, the dielectric substrate on the printed circuit board is divided into two parts, where the first part is the part covered by the trace 302 and the second part is the part not covered by the trace 302. The second part includes the frame 303 and the hollowed out area 304 that reduces the insertion loss.

Figure 4:
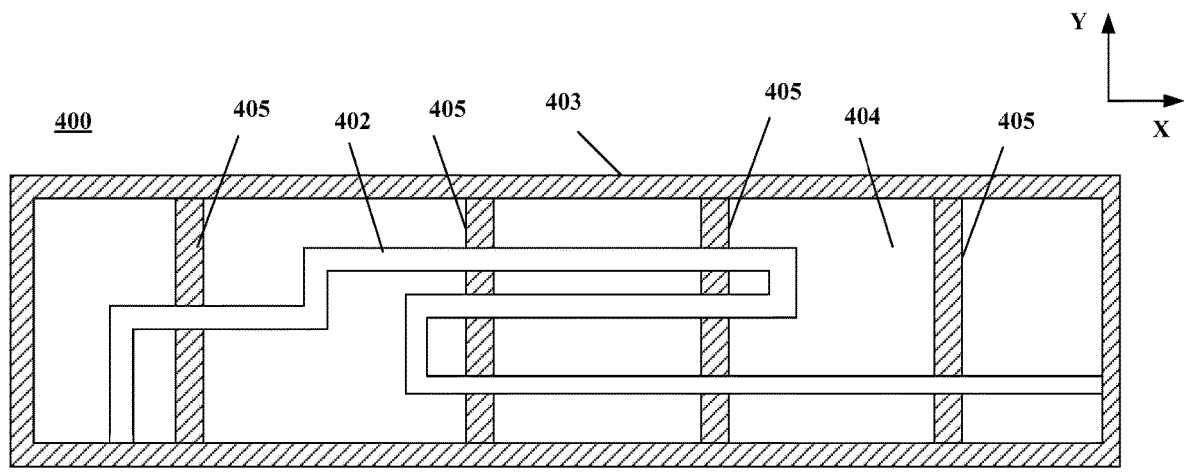
FIG. 4 shows a schematic diagram of a phase shifter according to some embodiments of the present disclosure.

FIG. 4 shows a schematic diagram of a phase shifter according to some embodiments of the present disclosure. As shown in FIG. 4, the phase shifter 400 includes a trace 402, a frame 403, a hollowed out area 404 and a plurality of support bars 405. Similar to the phase shifter 300 shown in FIG. 3, the trace 402 is capable of transmitting signals (for example, RF signals), the frame 403 is capable of supporting the trace 402 and the hollowed out area 404 helps to reduce the loss of signals transmitted in the trace 402.

The difference between the phase shifter 400 in FIG. 4 and the phase shifter 300 in FIG. 3 is that the phase shifter 400 is further provided with a plurality of support bars 405. Each support bar 405 extends along the Y direction (that is, a second direction), where one end of the support bar 405 is connected to the upper side (that is, a first side) of the frame 403 and the other end is connected to the lower side of the frame 403 (that is, the second side).

In some embodiments according to the present disclosure, the support bar 405 may be formed with the base material of the printed circuit board. For example, when forming the hollowed out area 404, apart from keeping the base material of the printed circuit board corresponding to the frame 403, a part of the base material may be kept appropriately to constitute the support bar 405.

Of course, the present disclosure is not limited thereto. For example, according to some embodiments of the present disclosure, one or a plurality of support bars 405 may be added to the phase shifter 300 shown in FIG. 3. The support bar 405 herein may be pre-manufactured member. The support bar 405 may be fixed to the frame 403 through methods such as bonding or screwing. The base material of the printed circuit board may be used as the material for the support bar 405, and other materials may also be used, such as low-loss plastic and foam materials.

The frame 403 of the phase shifter 400 is a rectangular frame and the left and right sides of the frame 403 (that is, third and fourth sides) are shorter than the length of the upper and lower sides of the frame 403. Installing a support bar 405 helps to improve the stability of the phase shifter 400 and prevents or reduces the deformation of the frame 403.

It should be understood that under the above teachings of the present disclosure, there are many ways to install the support bar.

Figure 5:
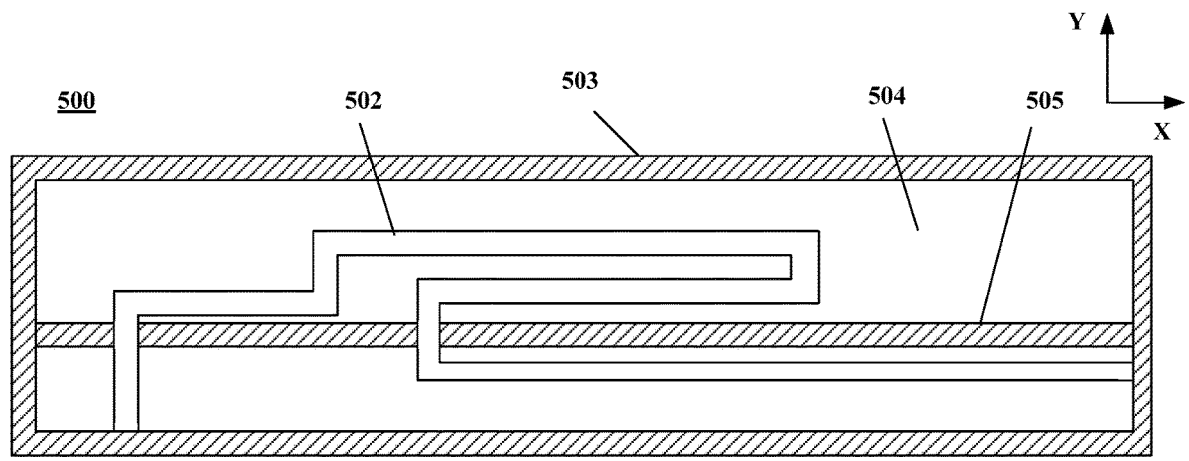
FIG. 5 shows a schematic diagram of a phase shifter according to some embodiments of the present disclosure.

FIG. 5 shows a schematic diagram of a phase shifter according to some embodiments of the present disclosure. As shown in FIG. 5, the phase shifter 500 includes a trace 502, a frame 503, a hollowed out area 504 and a support bar 505. Similar to the phase shifter 400 shown in FIG. 4, the trace 502 is capable of transmitting signals (for example, RF signals). The frame 503 and support bar 505 are capable of supporting the trace 502 and the hollowed out area 504 helps to reduce the insertion loss of signals transmitted through the phase shifter 500.

The difference between the phase shifter 500 in FIG. 5 and the phase shifter 400 in FIG. 4 is that the support bar 505 extends along the X direction, where one end is connected to the left side of the frame 503 and the other end is connected to the right side of the frame 503. It should be understood that this support bar 505 is similarly capable of providing support to the trace 502.

Figure 6:
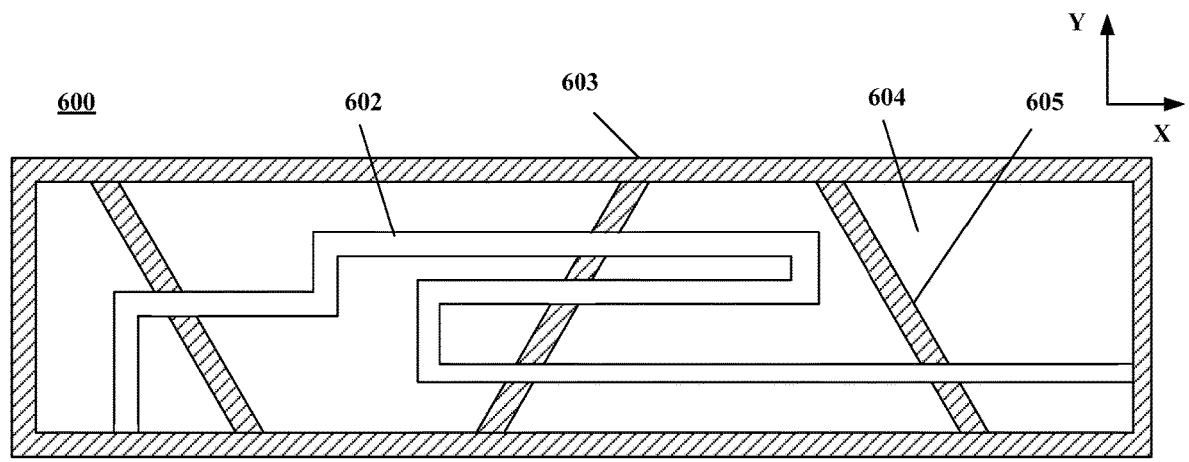
FIG. 6 shows a schematic diagram of a phase shifter according to some embodiments of the present disclosure.

FIG. 6 shows a schematic diagram of a phase shifter according to some embodiments of the present disclosure. As shown in FIG. 6, the phase shifter 600 includes a trace 602, a frame 603, a hollowed out area 604 and a plurality of support bars 605. Similar to the phase shifter 400 shown in FIG. 4, the trace 602 is capable of transmitting signals (for example, RF signals). The frame 603 and support bar 605 are capable of supporting the trace 602 and the hollowed out area 604 helps to reduce the loss of signals transmitted in the phase shifter 600.

The difference between the phase shifter 600 in FIG. 6 and the phase shifter 400 in FIG. 4 is that the support bar 605 is tilted (not parallel to each side of the frame 603). The support bar 605 is similarly capable of providing support to the trace 602 and reduces or prevents the deformation of the trace 602.

Figure 7:
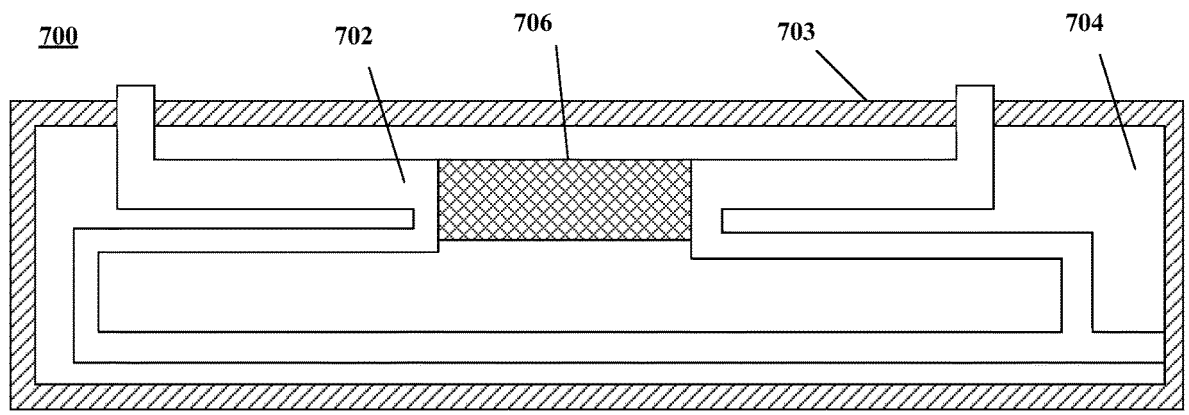
FIG. 7 shows a schematic diagram of a phase shifter according to some embodiments of the present disclosure.

FIG. 7 shows a schematic diagram of a phase shifter according to some embodiments of the present disclosure. As shown in FIG. 7, the phase shifter 700 includes a trace 702, a frame 703 and a hollowed out area 704. Similar to the phase shifter 300 shown in FIG. 3, the trace 702 is capable of transmitting signals (for example, RF signals). The frame 703 is capable of supporting the trace 702 and the hollowed out area 704 helps to reduce the insertion loss of signals transmitted in the phase shifter 700.

The phase shifter 700 further includes a resistor 706. The resistor 706 provided in the phase shifter 700 is capable of improving the vertical beam directivity of an antenna array formed by a feed network including the phase shifter and a radiating element.

The trace of existing phase shifters (for example, the conventional phase shifter 200 shown in FIG. 2) is suspended and very unstable. The trace is easily damaged or deformed when soldering the resistor or during subsequent transportation and use. In the phase shifter of the present disclosure, the frame and base material of the printed circuit board below the trace are capable of providing support to the trace. Therefore, the phase shifter according to the present disclosure is capable of safely soldering or installing the resistor in other ways without having to worry about deformation or damage of the phase shifter.

In addition, in some embodiments of the present disclosure, the resistor 706 may be suspended, that is, the base material of the printed circuit board below the resistor 706 may be removed. In some other embodiments of the present disclosure, the base material of the printed circuit board below the resistor 706 may be kept such that the resistor 706 is placed on the printed circuit board, so as to further improve the stability of the resistor 706.

Figure 8:
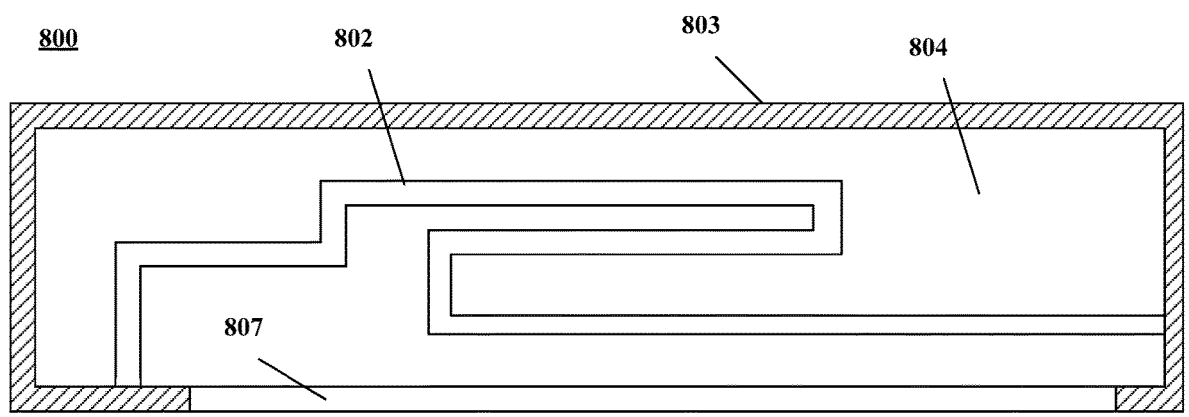
FIG. 8 shows a schematic diagram of a phase shifter according to some embodiments of the present disclosure.

FIG. 8 shows a schematic diagram of a phase shifter according to some embodiments of the present disclosure. As shown in FIG. 8, the phase shifter 800 includes a trace 802, a frame 803 and a hollowed out area 804. Similar to the phase shifter 300 shown in FIG. 3, the trace 802 is capable of transmitting signals (for example, RF signals). The frame 803 is capable of supporting the trace 802 and the hollowed out area 804 helps to reduce the insertion loss of signals transmitted in the trace 802.

In addition, one part of the frame 803 of the phase shifter 800 may be further provided with a metal layer 807, and the metal layer 807 is insulated from the trace 802. The metal layer 807 is capable of improving the strength of the frame 803 to provide support to the frame 803. According to some embodiments of the present disclosure, the metal layer 807 may be formed while forming the trace 802 on the printed circuit board. Alternatively, according to some other embodiments of the present disclosure, the metal layer 807 may be formed through methods such as bonding and deposition after forming the frame 803 and trace 802.

In the various embodiments shown in FIG. 3-FIG. 8, only one surface of the phase shifter is shown. However, the present disclosure is not limited thereto. For example, two surfaces of the printed circuit board (the first surface and second surface opposite to the first surface) may be independently provided with a trace. Alternatively, both surfaces may have a trace and be electrically connected through, for example, a through hole.

Figure 9:
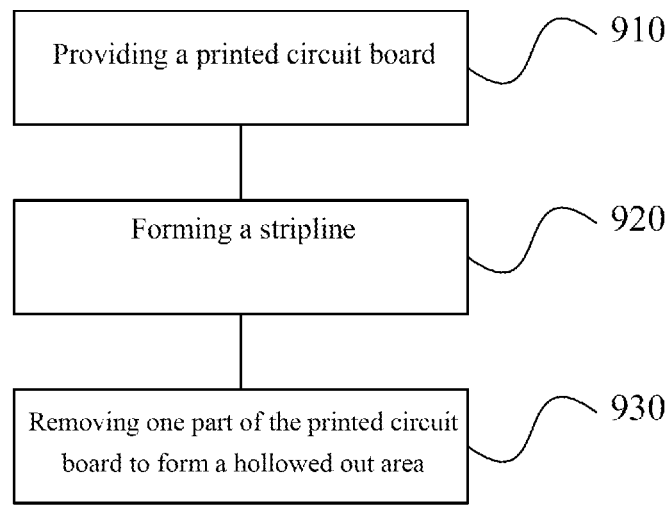
FIG. 9 shows a flow chart of a manufacturing method of a phase shifter according to an embodiment of the present disclosure.

FIG. 9 shows a flow chart of a manufacturing method of a phase shifter according to an embodiment of the present disclosure.

First, a printed circuit board is provided (Step 910). The printed circuit board may be single-sided copper clad or double-sided copper clad. Alternatively, the printed circuit board may be covered with one or a plurality of layers of other conductive materials, for example, gold, silver, aluminum, iron or tungsten. The base material of the printed circuit board is not limited and any suitable insulating medium may be used.

Then, the trace is formed on the printed circuit board (Step 920). For example, the trace may be formed by manufacturing the trace on the printed circuit board. More specifically, according to some embodiments of the present disclosure, the surface of the printed circuit board may be covered with a layer of a photosensitive material (for example, photoresist); then, the photosensitive material layer is patterned so that the pattern of the remaining photosensitive material on the printed circuit board is the same as the pattern of the trace to be formed; next, the conductive material on the surface of the printed circuit board may be etched (for example, wet etching) and the conductive material not covered by the photosensitive material is removed; finally, the remaining photosensitive material is removed to obtain the trace.

In addition, according to some embodiments of the present disclosure, the metal layer 807 shown in FIG. 8 may be formed while forming the trace, and this will not be repeated again here.

Finally, one part of the printed circuit board may be removed to form a hollowed out area (Step 930). For example, the base material of the printed circuit board near the trace may be removed, only keeping the peripheral part of the printed circuit board as the frame. Alternatively, the support bar and other structures may be kept as needed.

Figure 10:
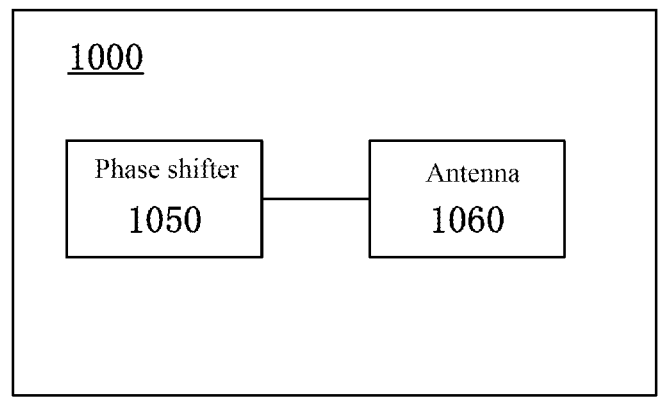
FIG. 10 shows a schematic diagram of a base station antenna according to some embodiments of the present disclosure.

FIG. 10 shows a schematic diagram of a base station antenna according to some embodiments of the present disclosure. As shown in FIG. 10, the base station antenna 1000 includes a phase shifter 1050 and an antenna 1060. The antenna 1060 comprises an array of radiating elements (not shown individually), as well as a feed network (not shown) that is configured to sub-divide RF signals that are to be transmitted through the antenna 1060 into a plurality of sub-components and to pass each subcomponent to a respective sub-array that includes one or more of the radiating elements. The phases of sub-components may be adjusted by using the phase shifter 1050 and sub-components of the RF signals that have the adjusted phases are transmitted through the radiating elements of antenna 1060. The phase shifter 1050 may use the various phase shifter structures according to the embodiments of the present disclosure above. This shall not be repeated again here.

Figure 11A:
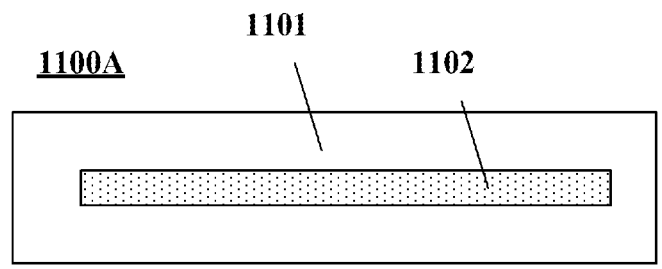
FIG. 11A shows a schematic diagram of a phase shifter manufactured using a printed circuit board in prior art.
Figure 11B:
FIG. 11B shows a schematic diagram of a phase shifter manufactured using a metal sheet in prior art.
Figure 11C:
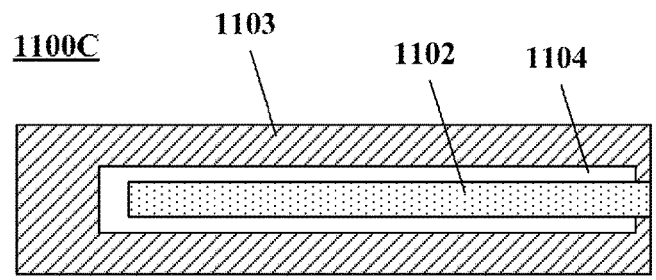
FIG. 11C shows a schematic diagram of a phase shifter according to some embodiments of the present disclosure.

FIG. 11A-FIG. 11C show schematic diagrams of phase shifters of three types of structures. FIG. 11A is a schematic diagram of a conventional phase shifter that includes a printed circuit board. The phase shifter 1100A includes a trace 1102 that is implemented as a metal pattern on a dielectric substrate of a printed circuit board 1101.

FIG. 11B is a schematic diagram of a conventional phase shifter that includes a sheet metal trace. The phase shifter 1100B includes a trace 1102 that may be formed by punching a sheet of metal.

FIG. 11C is a schematic diagram of a phase shifter according to some embodiments of the present disclosure. The phase shifter 1100C is formed using a printed circuit board. A metal trace 1102 is provided on the dielectric substrate of the printed circuit board. One or more portions of the dielectric substrate of the printed circuit board are removed so that the dielectric substrate of the printed circuit board defines a frame 1103 that has a hollowed out area 1104. The hollowed out area 1104 is formed by removing a portion of the dielectric substrate of the printed circuit board near the trace 1102.

Figure 12:
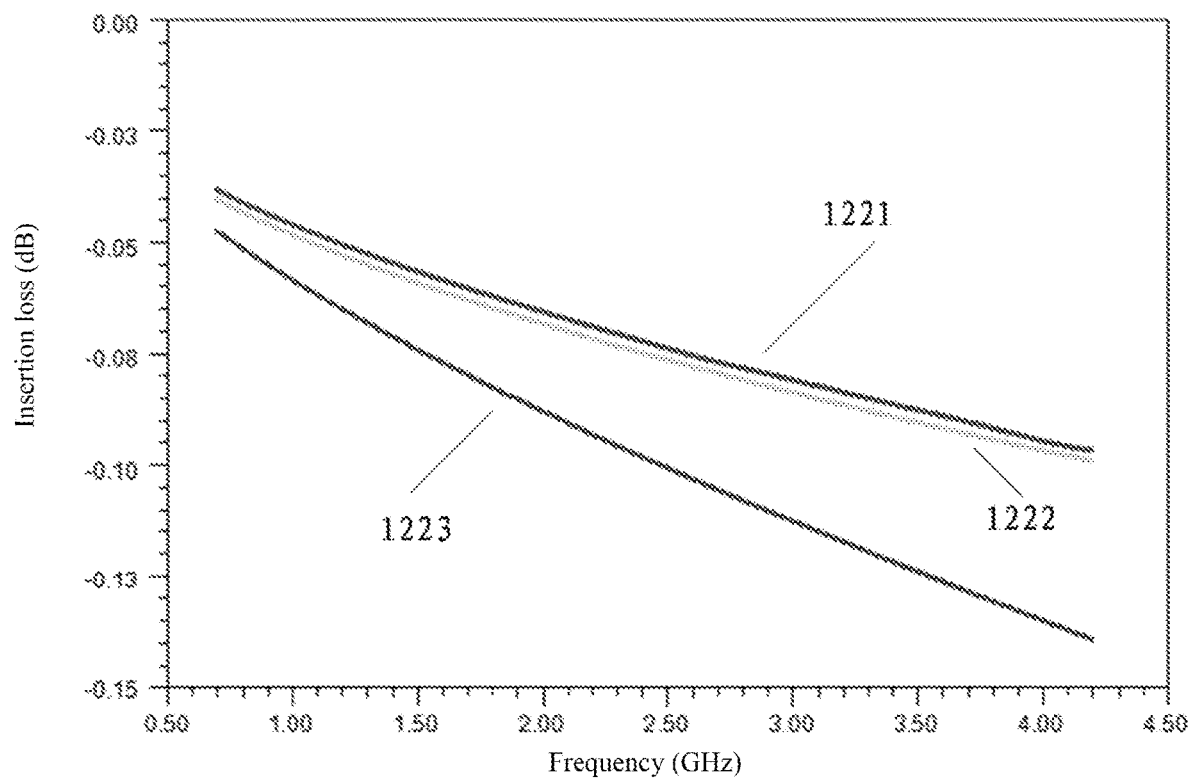
FIG. 12 shows a simulation diagram of insertion loss of phase shifters of three types of structures in FIG. 11A-11C.

FIG. 12 shows the results of a simulation of the insertion losses in dB vs. frequency in GHz of the traces of the phase shifters of FIG. 11A-FIG. 11C. In the simulation, the dielectric constant of the base material of the printed circuit boards in FIG. 11A and FIG. 11C is 2.94, the dielectric loss factor is 0.002 and the material of the trace is copper; the material of the trace in FIG. 11B is aluminum. As shown in FIG. 12, curve 1221 is the insertion loss of the phase shifter 1100C, curve 1222 is the insertion loss of the phase shifter 1100B, and curve 1223 is the insertion loss of the phase shifter 1100A. It can be seen here that the insertion loss when using the phase shifter 1100C of the present disclosure is close to the insertion loss of the phase shifter 1100B, which are both better than the insertion loss of the phase shifter 1100A manufactured using the printed circuit board in prior art.

Figure 13A:
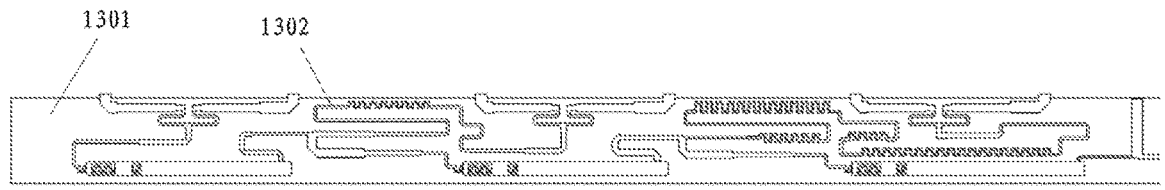
FIG. 13A shows a schematic diagram of a conventional phase shifter.
Figure 13B:
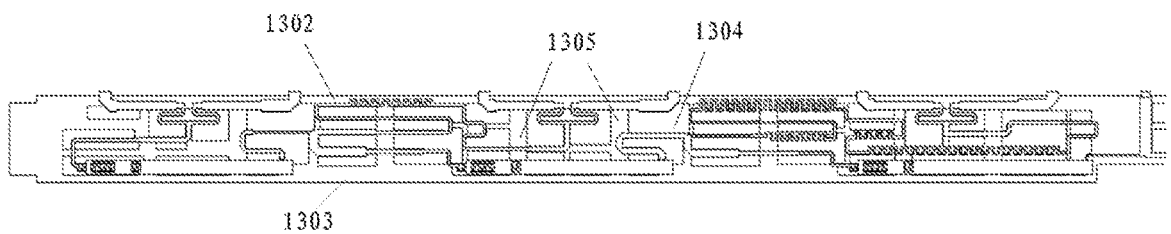
FIG. 13B shows a schematic diagram of a phase shifter according to an embodiment of the present disclosure.

FIG. 13A shows a schematic diagram of a phase shifter in prior art. FIG. 13B shows a schematic diagram of a phase shifter according to an embodiment of the present disclosure. In the phase shifter in FIG. 13A, the trace 1302 is formed on the dielectric substrate of the printed circuit board 1301. The structure of the trace 1302 of the phase shifter in FIG. 13A is similar to the structure of the trace 1302 of the phase shifter in FIG. 13B and the difference is that, in the phase shifter of FIG. 13B, portions of the dielectric substrate of the printed circuit board 1301 (FIG. 13A) that are near the trace 1302 are removed, forming a frame 1303, a hollowed out area 1304 and one or more support bars 1305.

Figure 14:
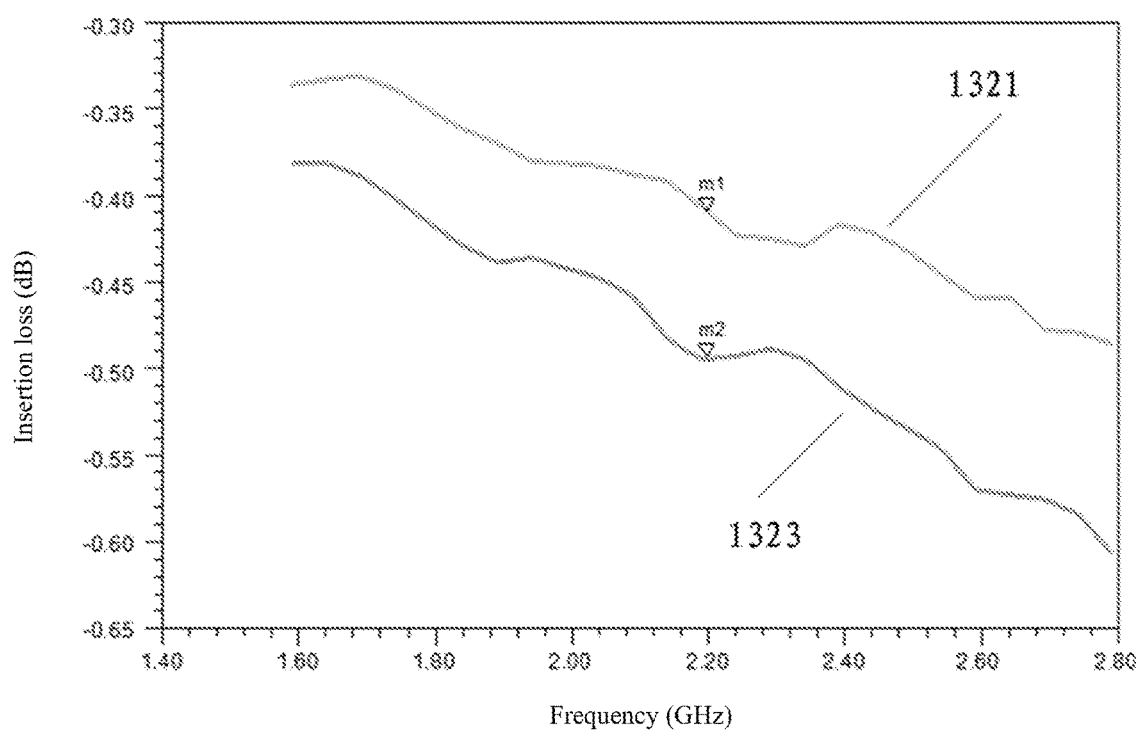
FIG. 14 shows measurement results of insertion loss of the phase shifters in FIG. 13A and FIG. 13B.

FIG. 14 shows measurement results of insertion loss in dB vs. frequency in GHz of the phase shifters in FIG. 13A and FIG. 13B. In FIG. 14, curve 1321 illustrates the insertion loss of the phase shifter according to an embodiment of the present disclosure in FIG. 13B and curve 1323 illustrates the insertion loss of the conventional phase shifter of FIG. 13A. It can be seen from FIG. 14 that the insertion loss of the phase shifter according to an embodiment of the present disclosure is smaller than the insertion loss of the conventional phase shifter. For example, at the same frequency of 2.20 GHz, the insertion loss corresponding to point m1 on curve 1321 is −0.4105 dB and the insertion loss corresponding to point m2 on curve 1323 is −0.4946 dB.

The words "front", "rear", "top", "bottom", "above", "below", etc. in the Specification and Claims, if present, are used for descriptive purposes and are not necessarily used to describe constant relative positions. It should be understood that the terms used in this way are interchangeable under appropriate circumstances, so that the embodiments of the present disclosure described herein, for example, can operate on other orientations that differ from those orientations shown herein or otherwise described.

As used herein, the word "exemplary" means "serving as an example, instance, or illustration" rather than as a "model" to be copied exactly. Any realization method described exemplarily herein is not necessarily interpreted as being preferable or advantageous over other realization methods. Furthermore, the present disclosure is not limited by any expressed or implied theory given in the above technical field, background art, summary of the invention or embodiments.

As used herein, the word "basically" means comprising any minor changes caused by design or manufacturing defects, device or component tolerances, environmental influences, and/or other factors. The term "basically" further allows the gap from the perfect or ideal situation due to parasitic effects, noise, and other practical considerations that may be present in the actual realization.

The above description may indicate elements or nodes or features that are "connected" or "coupled" together. As used herein, unless specified otherwise, "connect" means that an element/node/feature is directly electrically, mechanically, logically connected, or connected in other manners (or directly communicated) with another element/node/feature. Similarly, unless explicitly stated otherwise, "coupled" means that one element/node/feature can be mechanically, electrically, logically or otherwise connected with another element/node/feature in a direct or indirect manner to allow interaction, even though the two features may not be directly connected. That is, "couple" is intended to comprise direct and indirect linking of elements or other features, including connection using one or a plurality of intermediate components.

In addition, for reference purposes only, certain terms may be used in the description below without intending to be limitative. For example, unless the context clearly indicates, the words "first", "second" and other such numerical words involving structures or elements do not imply a sequence or order.

It should also be understood that when the term "include/comprise" is used in this text, it indicates the presence of the specified feature, entirety, step, operation, unit and/or component, but does not exclude the presence or addition of one or more other features, entireties, steps, operations, units and/or components and/or combinations thereof.

In the present disclosure, the term "provide" is used in a broad sense to cover all ways of obtaining an object, so "providing an object" includes but is not limited to "purchase", "preparation/manufacturing", "arrangement/setting", "installation/assembly", and/or "order" of the object, etc.

Those skilled in the art should realize that the boundaries between the above operations are merely illustrative. A plurality of operations can be combined into a single operation, which may be distributed in the additional operation, and the operations can be executed at least partially overlapping in time. Also, alternative embodiments may include a plurality of instances of specific operations, and the order of operations may be changed in various other embodiments. However, other modifications, changes and substitutions are also possible. Therefore, the Specification and attached drawings hereof should be regarded as illustrative rather than restrictive.

Although some specific embodiments of the present disclosure have been described in detail through examples, those skilled in the art should understand that the above examples are only for illustration rather than for limiting the scope of the present disclosure. The embodiments disclosed herein can be combined arbitrarily without departing from the spirit and scope of the present disclosure. Those skilled in the art should also understand that various modifications can be made to the embodiments without departing from the scope and spirit of the present disclosure. The scope of the present disclosure is defined by the attached claims.

That which is claimed is:

1. A phase shifter, comprising:
a printed circuit board that includes a dielectric substrate and a trace on the dielectric substrate, where the trace is configured to transmit signals,
wherein the dielectric substrate includes a first part covered by the trace and a second part not covered by the trace, where the second part includes at least one hollowed out area near the trace,
wherein the dielectric substrate includes a first surface and a second surface opposite to the first surface, where the trace is provided on the first surface and second surface.

2. A base station antenna, comprising:
an antenna; and
a phase shifter that comprises a printed circuit board that includes a dielectric substrate and a trace on the dielectric substrate, where the trace is configured to transmit signals,
wherein the dielectric substrate includes a first part covered by the trace and a second part not covered by the trace, where the second part includes at least one hollowed out area near the trace, and
wherein the trace is supported by at least one bar in the hollowed out area.

3. The phase shifter according to claim 2, wherein the second part further includes a frame that is located at the periphery of the printed circuit board and the at least one bar is attached to the frame.

4. The phase shifter according to claim 3, wherein the frame is substantially rectangular.

5. The phase shifter according to claim 2, wherein at least one part of the second part of the dielectric substrate is provided with a metal layer, and the metal layer is insulated from the trace.

6. The phase shifter according to claim 2, further including a resistor that is provided on the dielectric substrate and electrically connected to the trace.

7. A phase shifter, comprising:
a printed circuit board that includes a dielectric substrate and a trace on the dielectric substrate, where the trace is configured to transmit signals,
wherein the dielectric substrate includes a first part covered by the trace and a second part not covered by the trace, where the second part includes at least one hollowed out area near the trace,
wherein the second part further includes a frame that is located at the periphery of the printed circuit board,
wherein the frame includes a first side and a second side opposite to each other, and the second part further includes a support bar, where twe ends of the support bar are connected to the first side and second side of the frame, respectively.

8. The phase shifter according to claim 7, wherein the frame further includes a third side and a fourth side extending in a second direction,
wherein the first side and second side of the frame extend in a first direction different from the second direction, and the length of the third side is shorter than the length of the first side.

9. A base station antenna, including the phase shifter according to claim 7.

* * * * *

UNITED STATES PATENT AND TRADEMARK OFFICE
CERTIFICATE OF CORRECTION

PATENT NO. : 12,148,966 B2
APPLICATION NO. : 17/945224
DATED : November 19, 2024
INVENTOR(S) : Wang et al.

Page 1 of 1

It is certified that error appears in the above-identified patent and that said Letters Patent is hereby corrected as shown below:

In the Claims

Column 10, Line 37, Claim 7: Please correct "where twe ends" to read --where ends--

Signed and Sealed this
Eleventh Day of February, 2025

Coke Morgan Stewart
*Acting Director of the United States Patent and Trademark Office*